United States Patent
Tae et al.

(10) Patent No.: US 12,009,191 B2
(45) Date of Patent: Jun. 11, 2024

(54) THIN FILM, IN-SITU MEASUREMENT THROUGH TRANSPARENT CRYSTAL AND TRANSPARENT SUBSTRATE WITHIN PROCESSING CHAMBER WALL

(71) Applicant: Applied Materials, Inc., Santa Clara, CA (US)

(72) Inventors: Patrick Tae, Sunnyvale, CA (US); Blake W. Erickson, Gilroy, CA (US); Zhaozhao Zhu, Milpitas, CA (US); Michael David Willwerth, Campbell, CA (US); Barry Paul Craver, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 809 days.

(21) Appl. No.: 16/946,263

(22) Filed: Jun. 12, 2020

(65) Prior Publication Data

US 2021/0391157 A1    Dec. 16, 2021

(51) Int. Cl.
*H01J 37/32*    (2006.01)
*G01B 11/06*    (2006.01)
*H01L 21/66*    (2006.01)

(52) U.S. Cl.
CPC .... *H01J 37/32972* (2013.01); *G01B 11/0625* (2013.01); *G01B 11/0683* (2013.01);
(Continued)

(58) Field of Classification Search
CPC ........... H01J 37/32972; H01J 37/32467; H01J 37/32862; H01J 37/32963;
(Continued)

(56) References Cited

U.S. PATENT DOCUMENTS 4,415,402 A * 11/1983 Gelernt ................. G01N 21/67
204/192.33
4,594,226 A    6/1986 Reedy
(Continued)

FOREIGN PATENT DOCUMENTS

CN    111751312 A    10/2020
JP    H11288921 A    10/1999
(Continued)

OTHER PUBLICATIONS

Machine Translation f JP 2004-259768 (Year: 2004).*
(Continued)

*Primary Examiner* — Rodney G McDonald
(74) *Attorney, Agent, or Firm* — Lowenstein Sandler LLP

(57) ABSTRACT

A system includes a transparent crystal, at least part of which is embedded within a wall and a liner of a processing chamber. The transparent crystal has a proximal end and a distal end, the distal end having a distal surface exposed to an interior of the processing chamber. A transparent thin film is deposited on the distal surface and has chemical properties substantially matching those of the liner. A light coupling device is to: transmit light, from a light source, through the proximal end of the transparent crystal, and focus, into a spectrometer, light received reflected back from a combination of the distal surface, a surface of the transparent thin film, and a surface of a process film layer deposited on the transparent thin film. The spectrometer is to detect a first spectrum within the focused light that is representative of the process film layer.

19 Claims, 9 Drawing Sheets

(52) U.S. Cl.
CPC .. *H01J 37/32467* (2013.01); *H01J 37/32862* (2013.01); *H01J 37/32963* (2013.01); *H01L 22/26* (2013.01); *H01J 2237/24585* (2013.01); *H01J 2237/332* (2013.01)

(58) Field of Classification Search
CPC ...... H01J 2237/24585; H01J 2237/332; H01L 22/26; H01L 22/12; G01B 11/0625; G01B 11/0683
USPC .............................................. 438/7; 118/688
See application file for complete search history.

(56) References Cited

U.S. PATENT DOCUMENTS

| | | | |
|---|---|---|---|
| 6,025,916 A | 2/2000 | Quick et al. | |
| 6,406,924 B1 | 6/2002 | Grimbergen et al. | |
| 7,227,624 B2 * | 6/2007 | Fink ................ | H01J 37/32935 118/712 |
| 7,578,301 B2 | 8/2009 | Hudson et al. | |
| 7,591,923 B2 | 9/2009 | Mitrovic et al. | |
| 8,009,288 B2 | 8/2011 | Berlin et al. | |
| 8,101,906 B2 | 1/2012 | Tallavarjula et al. | |
| 8,144,328 B2 | 3/2012 | Venugopal et al. | |
| 8,513,002 B2 | 8/2013 | Berlin et al. | |
| 9,347,132 B2 | 5/2016 | Ramachandran et al. | |
| 10,008,370 B2 | 6/2018 | Ohmori et al. | |
| 10,269,545 B2 | 4/2019 | Gottscho | |
| 10,615,009 B2 | 4/2020 | Guha et al. | |
| 10,796,891 B2 | 10/2020 | Kim et al. | |
| 11,114,286 B2 | 9/2021 | Lin et al. | |
| 11,276,564 B2 | 3/2022 | Gottscho | |
| 11,499,869 B2 | 11/2022 | Lin et al. | |
| 2005/0127192 A1 | 6/2005 | Kang et al. | |
| 2005/0173239 A1 | 8/2005 | Somekh et al. | |
| 2005/0173375 A1 | 8/2005 | Mitrovic et al. | |
| 2009/0218314 A1* | 9/2009 | Davis ................ | H01J 37/32935 385/115 |
| 2011/0155059 A1* | 6/2011 | Egami ................ | C23C 16/4401 118/723 E |
| 2015/0214016 A1 | 6/2015 | Ham et al. | |
| 2015/0226540 A1* | 8/2015 | Rajagopalan ....... | C23C 16/4557 356/402 |
| 2016/0177449 A1 | 6/2016 | Ohmori et al. | |
| 2018/0164215 A1 | 6/2018 | Glacer et al. | |
| 2020/0013558 A1 | 1/2020 | Lian et al. | |
| 2020/0013588 A1 | 1/2020 | Lian et al. | |
| 2020/0303169 A1 | 9/2020 | Sakai | |
| 2021/0391157 A1 | 12/2021 | Tae et al. | |

FOREIGN PATENT DOCUMENTS

| | | | |
|---|---|---|---|
| JP | 2003077843 A | | 3/2003 |
| JP | 2004-259768 | * | 9/2004 |
| JP | 2005175101 A | | 6/2005 |
| JP | 2007258238 A | | 10/2007 |
| KR | 20080099695 A | | 11/2008 |
| KR | 10-20110127389 | | 11/2011 |
| KR | 10-2025873 | | 9/2019 |
| KR | 102182057 B1 | | 11/2020 |
| WO | 2004032177 A2 | | 4/2004 |
| WO | 2020142451 A1 | | 7/2020 |
| WO | 2020246745 A1 | | 12/2020 |
| WO | 2021061541 A1 | | 4/2021 |

OTHER PUBLICATIONS

PCT Notification of Transmittal of The International Search Report and The Written Opinion Of The International Searching Authority for PCT Application No. PCT/US2021/037108, dated Oct. 5, 2021, 9 pages.

International Search Report and Written Opinion for International Application No. PCT/US2022/043518, dated Jan. 4, 2023, 10 pages.

\* cited by examiner

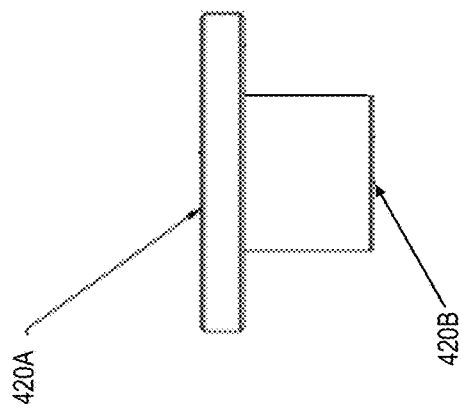
FIG. 4B
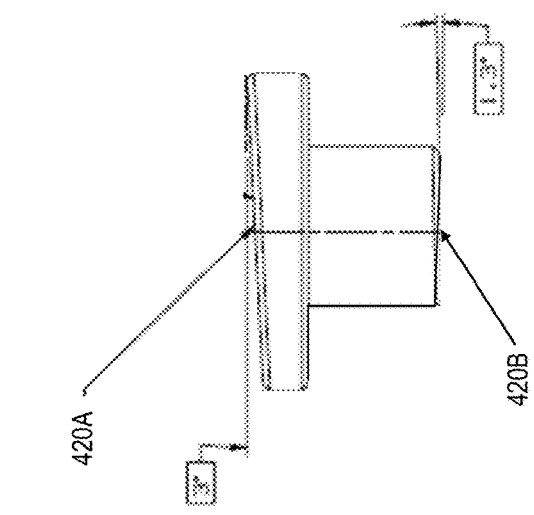
FIG. 4C
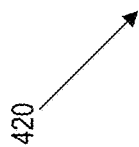

THIN FILM, IN-SITU MEASUREMENT THROUGH TRANSPARENT CRYSTAL AND TRANSPARENT SUBSTRATE WITHIN PROCESSING CHAMBER WALL

TECHNICAL FIELD

Embodiments of the present disclosure relate to thin film, in-situ measurement through transparent crystal and transparent substrate within a processing chamber wall.

BACKGROUND

Changes to the surfaces of a processing chamber impacts various processing parameters. For example, re-deposition of etching byproducts on the chamber wall may alter the etching rate of a given process. Accordingly, as substrates are processed in the chamber, the etching rate (or other process parameters or states) may change and result in non-uniform processing between substrates.

There is currently no reliable method for monitoring surface condition within a processing chamber, including surfaces of a liner (or inside wall), lid, electrostatic chuck (ESC), process ring, and the like. For example, the chemical, physical, and thermal condition of the liner of a processing chamber is known to impact plasma processes by affecting the recombination of outgassing near the liner. Several monitoring methods, such as capacitive or resonant frequency monitoring, are in development but these methods suffer from thermal or radio frequency noise, particularly during processing.

Further, substrate processing is subject to inefficiencies and/or inaccuracies due to a lack of in-processing information, particularly as processing equipment ages. For example, after process shift in a processing chamber over time, processing can sometimes result in a change in deposition amount (e.g., deposition thickness) or a change in composition of the deposition, both of which may lead to unacceptable batches of processed substrates that have to be scrapped. Further, knowing when to run a cleaning process within the processing chamber can be guesswork (e.g., based on only in-process hours), and running the cleaning process too often can impact substrate throughput. Other processing inefficiencies or inaccuracies exist and will be discussed in more detail.

SUMMARY

Some of the embodiments described herein cover a processing system that includes a transparent crystal, where at least part of the transparent crystal is embedded within a wall and a liner of a processing chamber. The transparent crystal has a proximal end and a distal end, the distal end having a distal surface that is exposed to an interior of the processing chamber. A transparent thin film is deposited on the distal surface of the transparent crystal, the transparent thin film having chemical properties substantially matching those of the liner. The system further includes a spectrometer and a light coupling device coupled to the spectrometer. The light coupling device is to transmit light, from a light source, through the proximal end of the transparent crystal and focus, into the spectrometer, light received reflected back from a combination of the distal surface, a surface of the transparent thin film, and a surface of a process film layer deposited on the transparent thin film. The spectrometer is to detect a first spectrum within the focused light that is representative of the process film layer.

In additional or related embodiments, a processing chamber includes a wall to define an interior of the processing chamber, a liner attached to an inside surface of the wall, and a transparent crystal, where at least part of the transparent crystal is embedded within the wall and the liner. The transparent crystal has a proximal end and a distal end, the distal end having a distal surface that is approximately flush with the inside surface of the wall. The processing chamber further includes a transparent thin film deposited on the distal surface of the transparent crystal. The transparent thin film has chemical properties substantially matching those of the liner. Light from outside of the wall is to pass through the transparent crystal and reflect off the distal surface and off a surface of the transparent thin film back through the proximal end of the transparent crystal.

In some embodiments, a related method includes embedding at least part of a transparent crystal within a wall and a liner of a processing chamber. The transparent crystal has a proximal end and a distal end, the distal end having a distal surface that is exposed to an interior of the processing chamber. The method further includes depositing, on the distal surface of the transparent crystal, a transparent thin film comprising chemical properties substantially matching those of the liner. The method further includes depositing, on the transparent thin film within the processing chamber, a process film layer. The method further includes transmitting light, from a light source by a light coupling device, through the proximal end of the transparent crystal. The method further includes focusing, by the light coupling device into a fiber optic cable, light received reflected back from a combination of the distal end of the liner, a surface of the transparent thin film, and a surface of the process film layer. The method further includes receiving, by the spectrometer, the focused light from the fiber optic cable and detecting, by the spectrometer within the focused light, a first spectrum that is representative of the process film layer.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4B is a simplified side view of the transparent crystal that includes no surface angles, according to an embodiment.

FIG. 4C is a detailed side view of the transparent crystal with relevant dimensions, including some angles of FIG. 4A, according an embodiment.

DETAILED DESCRIPTION OF EMBODIMENTS

Figure 1:
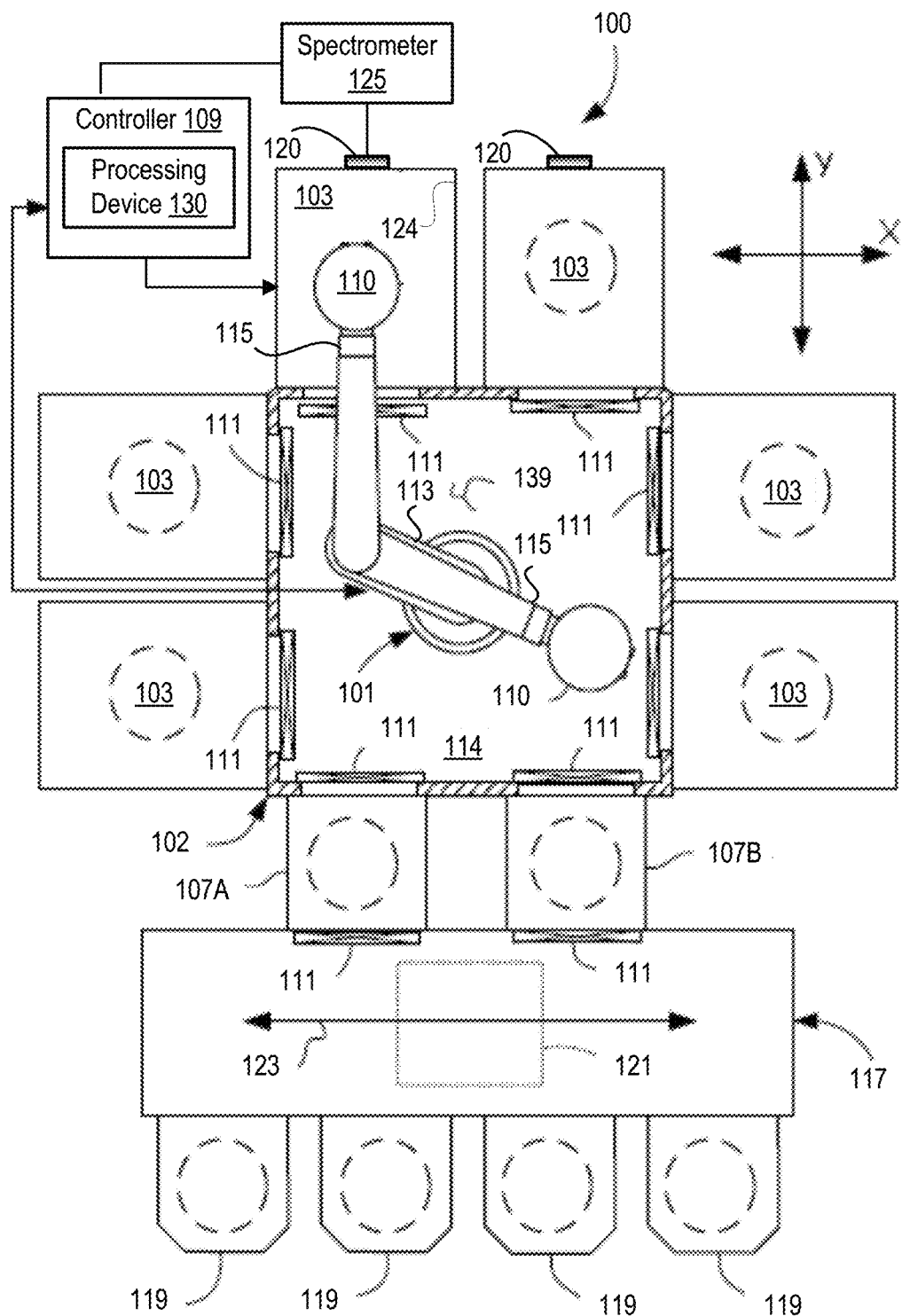
FIG. 1 is a top schematic view of an example processing system, according to an embodiment.

Embodiments described herein relate to systems and methods for use of interferometric reflectometry with reference to a liner (or inner wall) of a processing chamber to monitor a condition and/or process state of the processing chamber. Reflectometry, for example, may be used to determine one or more optical thin film property of a thin film layer (e.g., a process film layer) deposited on the liner surface or on a reflector surface that is proximate to and substantially represents the liner. Such optical thin film properties include, but are not limited to thickness, values of refractive index (n) and extinction coefficient (k) values, which values may be used to determine a composition material, as will be discussed in more detail. In some embodiments, determining the process state of the processing chamber occurs during processing of substrates within the processing chamber, and thus can involve adapting for the presence of plasma in the processing chamber. Plasma includes corrosive gases used for etching the substrates. In other embodiments, one or more optical thin film property are determined before or after processing, and thus need not compensate for extant plasma during an active process.

In various embodiments, determining the condition of the liner of the processing chamber is indicative of the condition of surfaces of the processing chamber generally, including whether there has been a process shift (or drift) for which correction should be taken, such as, for example, calibration, cleaning, or replacement of processing equipment or of other structures of the processing chamber. Such process shift may impact performance and yield of processed substrates. Further, determining a thickness of deposited film layers may be commensurate with deposited thin films on substrates being processed (if measured during processing), and thus may be used to confirm proper deposition rates, amounts, and when and how much to clean a processing chamber after processing. Fluorine content in plasma may also be measured and tracked over time. Further advantages include being able to perform reflectometry in a way that involves minimal disruption to the plasma volume during substrate processing, and reducing hardware-induced skew and particle risks. The present embodiments also involves minimal modification to existing liner and processing chamber designs.

More specifically, a disclosed system and methods include a light source (e.g., broadband light source), a spectrometer (or other apparatus for recording and measuring spectra as a method of analysis), and a light coupling device such as a collimator or mirror. These embodiments, as well as a processing chamber that is part of the disclosed system, may further include a transparent crystal at least a part of which is embedded within a wall and the liner of the processing chamber. The transparent crystal may be made of a transparent ceramic material, or may be made of a transparent material such as sapphire, diamond, quartz, or silicon carbide for example. A transparent thin film (or substrate) may be formed on a surface of the transparent crystal that is exposed to an interior of the processing chamber. The transparent thin film may be deposited via a pre-deposition using atomic layer deposition (ALD), chemical vapor deposition (CVD), or plasma vapor deposition (PVD) of yttrium oxide, aluminum oxide, zirconium oxide, or the like transparent alloy. In one embodiment, the transparent thin film is approximately flush with a surface of the liner. The transparent thin film may also have chemical properties substantially matching those of the liner.

Specifically, the transparent thin film formed on the transparent crystal improves the signal-to-noise ratio (SNR) of the reflected light and measuring accuracy of the spectrometer. For example, when positioned adjacent to or flush with the liner as a separate structure, the transparent thin film may enable greater control of the film stack created on the transparent thin film. For example, the transparent thin film may be engineered for desired optical and/or chemical properties. The desired optical properties include to produce clearly visible interferometric fringes when a new process film layer is deposited on top of the transparent thin film. This may enhance the detection sensitivity, and thus improve the SNR. The desired chemical properties may include, for example, high chemical resistance to the process chemistries that minimize physical or chemical change to the transparent thin film in order to maximize lifetime. Further, the chemical properties should mirror the chemical properties of the liner material in order to ensure that deposition on the transparent thin film mimics the deposition on the liner as much as possible.

In various embodiments, during processing within the chamber, the light coupling device may direct light from the light source through the transparent crystal, through the transparent thin film, and to a process film layer deposited on the transparent thin film. In this way, light passing through both the transparent crystal and the transparent thin film reflect back from their respective surfaces, and combine with light reflected off a surface of the process film layer deposited on the transparent thin film. This reflected light may include a first spectrum consistent with the condition of the process film layer deposited on the liner.

In these embodiments, the light coupling device focuses the combination of this reflected light into a fiber optic cable that is coupled to a spectrometer. The spectrometer may detect the first spectrum of the focused light that is representative of the process film layer and may be used to determine optical thin film properties. The spectrometer may also, during processing within the chamber, detect a second spectrum of the focused light when the light source is turned off. This second spectrum corresponds to the optical emission spectroscopy (OES) of the plasma at that moment and can be removed from the first spectrum to result in a reflectometry signal capable of being processed.

For example, the embodiments of the system and method may also include a processing device (or controller) coupled to the spectrometer. The processing device may be adapted to receive the first spectrum and the second spectrum, and calculate reflectometry data by subtracting (e.g., subtraction of) the second spectrum from the first spectrum. The processing device may calculate a reflectometry signal by dividing (e.g., division of) the reflectometry data by a reference spectrum, which normalizes the reflectometry data. The reference spectrum may be obtained under known conditions, such as during initial installation of the system.

The processing device may then fit the reflectometry signal to a thin film optical model to determine information that includes one or more optical thin film property of the process film layer. Such optical thin film properties include, but are not limited to, thickness, values of refractive index (n) and extinction coefficient (k) values, and a composition material, as will be discussed in detail. In some embodiments, assumptions about the plasma used, expected deposition thickness, estimated prior film accumulations, and the like may be made in order to fit data of the reflectometry signal to the thin film model to determine the composition material of the process film layer. The one or more optical thin film property may in turn inform determination of certain endpoints associated with processes performed within the processing chamber, including, but not limited to, whether to adjust a rate of deposition, when to stop deposition of a chemical or plasma, when to start cleaning the processing chamber, when to stop cleaning the processing chamber, and an amount process drift or spent chamber life.

In an embodiment, for example, the processing device (or controller) compares the thickness of the process film layer on the transparent thin film with a baseline measurement, e.g., taken when the processing chamber was first put into operation. If this value varies beyond a threshold variation (e.g., for thickness of the process film layer), the processing device may trigger a process within the processing chamber that is to correct the rate of deposition of the process film layer. The processing device may also alter a process to restore a process state or may alert a user of the processing chamber of a process shift, among other actions that will be discussed.

FIG. 1 is a top schematic view of an example processing system 100, according to one aspect of the disclosure. The processing system 100 includes a transfer chamber robot 101 and a factory interface robot 121 each adapted to pick and place substrates 110 (sometimes referred to as "wafers" or "semiconductor wafers") from or to a destination in an electronic device processing system such as the processing system 100 illustrated in FIG. 1. However, any type of electronic device substrate, mask, or other silica-containing substrate (generally referred to as "substrates" herein) may be conveyed and transferred by the disclosed robots. For example, the destination for the substrates 110 may be one or more processing chambers 103 and/or one or more of the load lock apparatus 107A, 107B that may be distributed about and coupled to a transfer chamber 114. As shown, substrate transfers may be through slit valves 111, for example.

The processing system 100 may further include a mainframe 102 including the transfer chamber 114 and at least two processing chambers 103. A housing of the mainframe 102 includes the transfer chamber 114 therein. The transfer chamber 114 may include top wall (not shown), bottom wall (floor) 139, and side walls, and, in some embodiments, may be maintained in a vacuum, for example. In the depicted embodiment, the transfer chamber robot 101 is mounted to the bottom wall (floor) 139. However, the transfer chamber robot 101 could be mounted elsewhere, such as to the top wall.

In various embodiments, the processing chambers 103 may be adapted to carry out any number of processes on the substrates 110. The processes may include deposition, oxidation, nitration, etching, polishing, cleaning, lithography, metrology, or the like. Other processes may be carried out as well. The load lock apparatus 107A, 107B may be adapted to interface with a factory interface 117 or other system component, that may receive substrates 110 from substrate carriers 119 (e.g., Front Opening Unified Pods (FOUPs)) that may be docked at load ports of the factory interface 117, for example. The factory interface robot 121 (shown dotted) may be used to transfer the substrates 110 between the substrate carriers 119 and each load lock apparatus 107A, 107B. Transfers of the substrates 110 may be carried out in any sequence or direction. The factory interface robot 121 may be identical (or similar) to the transfer chamber robot 101 in some embodiments, but may further include a mechanism to allow the factory interface robot to move laterally in either lateral direction and indicated by arrow 123. Any other suitable robot may be used as the factory interface robot 121.

In embodiments, and by way of exemplified explanation for any robot, the transfer chamber robot 101 includes at least one arm 113 (e.g., a robot arm) and at least one end effector 115 coupled to the arm 113. The end effector 115 is controllable by the transfer chamber robot 101 in order to pick up a substrate 110 from a load lock apparatus 107A or 107B, guide the substrate 110 through one of the slit valves 111 of a processing chamber 103, and accurately place the substrate 110 onto a substrate support of the processing chamber 103.

In various embodiments, one or more of the processing chambers 103 may include a transparent crystal 120, at least a part of which is embedded in a wall and liner 124 (e.g., inner wall) of the processing chamber 103. In disclosed embodiments, light may be collimated and directed through the transparent crystal 120 to generate reflected light. The reflected light may then travel back through the transparent crystal 120, as will be discussed in more detail with reference to FIGS. 2-6. The reflected light may be focused into a fiber optic cable that is coupled to a spectrometer 125 for spectrum analysis. The spectrometer 125 may perform reflectometry to determine one or more spectrum of the focused light that may be used to determine at least one optical property of a deposited process film layer on a transparent thin film of the transparent crystal, whether during or after substrate processing.

A controller 109 (e.g., a tool and equipment controller) may control various aspects of the processing system 100, e.g., gas pressure in the processing chamber 103, individual gas flows, spatial flow ratios, temperature of various chamber components, and radio frequency (RF) or electrical state of the processing chamber 103. The controller 109 may receive signals from and send commands to the factory interface robot 121, the transfer chamber robot 101, one or more sensors, and/or other processing components of the processing system 100. The controller 109 may thus control the initiation and cessation of processing, may adjust a deposition rate, type or mix of deposition composition, and the like. The controller 109 may further receive and process sensing data from various sensors.

In various embodiments, the controller 109 includes (or is coupled to) a processing device 130 and is coupled to the spectrometer 125. The processing device 130 may be configured to receive and process sensing data, including the results of reflectometry performed by the spectrometer 125, including the aforementioned first spectrum and second spectrum. The processing device 130 may calculate the reflectometry signal by subtracting the second spectrum from the first spectrum. The processing device may then fit the reflectometry signal to a thin film optical model to determine information that includes one or more optical thin film property of the process film layer. Depending on results of analyzing the one or more optical film property, the processing device 130 (e.g., the controller 109) may direct the processing chamber 103 in a process change or adjustment. For example, the controller 109 may adjust a processing parameter or setting, such as, for example, a rate of deposition, a type or mix of deposition composition, timing of performing a cleaning process within the processing chamber, and other actions that will be discussed in more detail with reference to FIG. 7.

The controller 109 and/or the processing device 130 may be and/or include a computing device such as a personal computer, a server computer, a programmable logic controller (PLC), a microcontroller, and so on. The controller 109 and/or the processing device 130 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 and/or the processing device 130 may include a data storage device (e.g., one or more disk drives and/or solid state drives), a main memory, a static memory, a network interface, and/or other components. The processing device 130 may execute instructions to perform any one or more of the methodologies and/or embodiments described herein. The instructions may be stored on a computer readable storage medium, which may include the main memory, static memory, secondary storage and/or processing device (during execution of the instructions).

Figure 2:
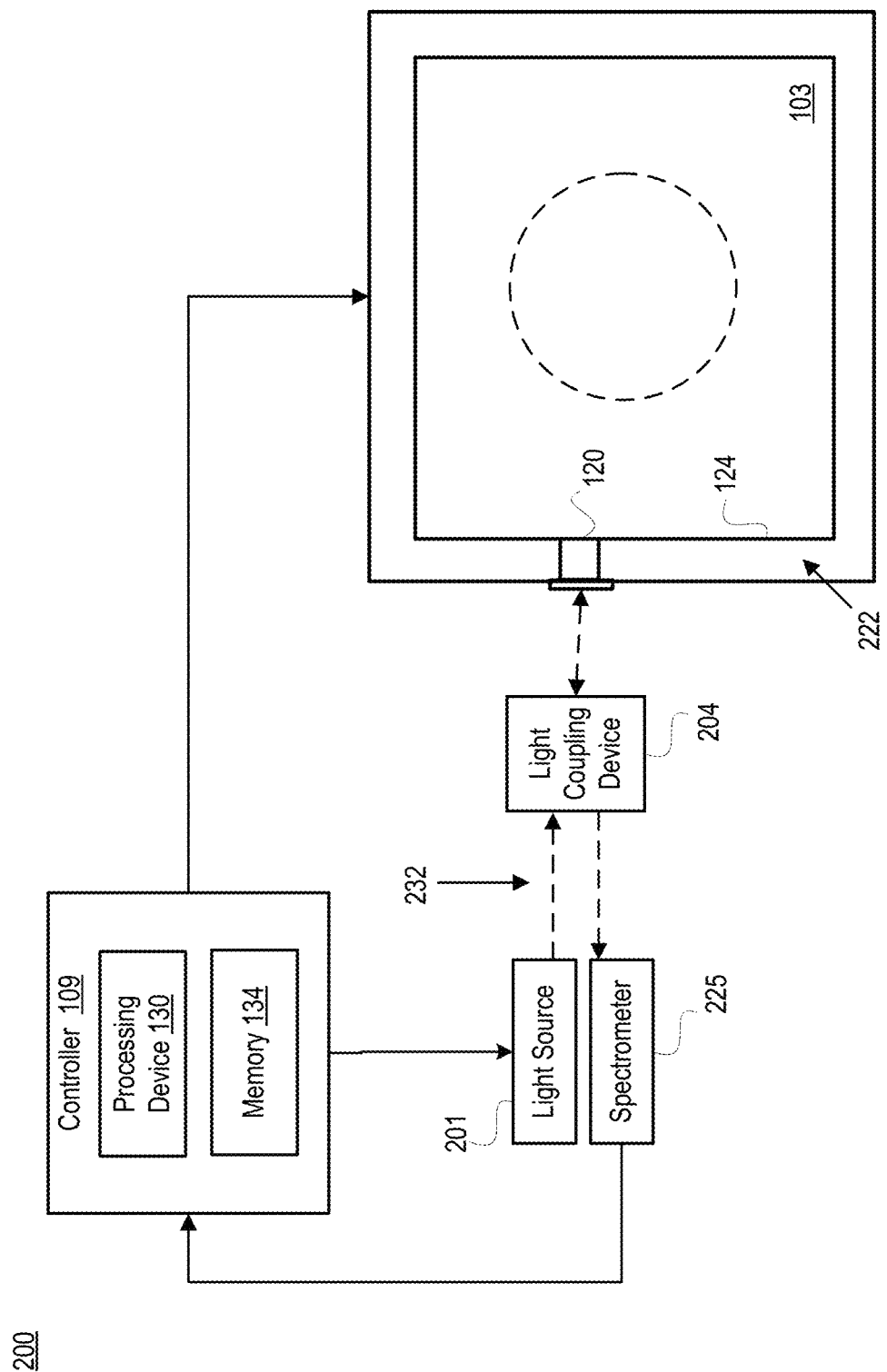
FIG. 2 is a simplified side view of a system for monitoring a processing chamber, according to an embodiment.

FIG. 2 illustrates a simplified side view of a system 200 for monitoring a processing chamber, according to one aspect of the disclosure. The system 200 may include, for example, the processing chamber 103, which has the liner 124, as was illustrated in FIG. 1. The processing chamber 103 may include a wall 222 to which the liner 124 is attached. The liner 124 is specially designed to have high chemical resistance to the process chemistries that minimize physical or chemical change to the liner in order to maximize lifetime. Furthermore, at least part of the transparent crystal 120 may be embedded within the wall 222 and the liner 124, as illustrated. The transparent crystal 120 may be made of transparent ceramic material, or may be made of a durable transparent material such as sapphire, diamond, quartz, silicon carbide, or a combination thereof.

In embodiments, the system 200 further includes a light source 201 (e.g., a broadband light source or other source of electromagnetic radiation), a light coupling device 204 (e.g., a collimator or a mirror), a spectrometer 225, the controller 109, and the processing device 130. The light source 201 and spectrometer 225 may be optically coupled to the light coupling device 204 through one or more fiber optic cable 232.

In an embodiment, the light source 201 is a flash lamp restricted to a 200-800 nanometer (nm) wavelength range, is a pulsed Xenon source, and has less than 0.5% sigma flash power variation across a full wavelength range within an open loop. In other embodiments, the wavelength range may further vary, for example, and may be set around near infrared wavelengths. The variable power control of the light source 201 may be between 45% and 100%, while providing less than an 8% power decrease over a lifetime of at least one year, which can provide more than a billion flashes. Additional or different embodiments are envisioned for a light source 201 with varying capabilities and wavelengths.

In various embodiments, the light coupling device 204 may be adapted to collimate or otherwise transmit light in two directions along an optical path. A first direction may include light from the light source 201 that is to be collimated and transmitted into the processing chamber 103 through the transparent crystal 120. A second direction may be reflected light from the transparent crystal 120 that passes back into the light coupling device 204, which will be discussed in more detail with reference to FIG. 3. The reflected light may be focused into the fiber optic cable 232 and thus directed to the spectrometer 225 in the second direction along the optical path. Further, the fiber optic cable 232 may be coupled between the spectrometer 225 and the light source 201 for efficient transfer of light between the light source 201, to the transparent crystal 120, and back to the spectrometer 225.

In an embodiment, the spectrometer 225 also has a 200-800 nm wavelength range, a wavelength resolution of less than 2 nm full width at half maximum, a dynamic range of at least 16 bits, a noise floor of less than 32 counts, and a sampling rate of 6 milliseconds (ms) or faster. The spectrometer 225 may need calibration at the same schedule or longer compared to the light source 201. The spectrometer 225 may be adapted to detect a spectrum of the reflected light received from the light coupling device 204, e.g., the light that has reflected back from the transparent crystal 120 and been focused by the light coupling device 204 into the fiber optic cable 232.

In various embodiments, the controller 109 includes or is coupled to the processing device 130 and includes or is coupled to a memory 134 or other computer storage. The controller 109 may be coupled to both the light source 201, the spectrometer 225, and the processing chamber 103. The controller 109 may direct the light source 201 to flash on and then receive the first spectrum from the spectrometer 225. The controller 109 may also keep the light source off and receive a second spectrum from the spectrometer 225 when the light source 201 is off. The second spectrum may represent the OES of the plasma or chemical process within the processing chamber. The processing device 130 may subtract the second spectrum from the first spectrum to determine the reflectometry signal for a moment in time. The processing device 130 may then mathematically fit the reflectometry signal to one or more thin film models to determine one or more optical thin film property of the process film layer that is deposited on the transparent thin film of the transparent crystal 120.

In some embodiments, the one or more optical thin film property include deposited film thickness as well as the refractive index (n) and extinction coefficient (k) values. The refractive index is the ratio of the speed of light in a vacuum to the speed of light in the process film layer. The extinction coefficient is a measure of how much light is absorbed in the process film layer. The processing device 130 may determine, using the n and k values, a composition of the process film layer. The processing device 130 may further be configured to analyze the data of the one or more optical film property, and trigger a new process or update a current process within the processing chamber 103 based on the analysis. Such updates may include alerts and will be discussed in more detail with reference to FIG. 7.

Figure 3:
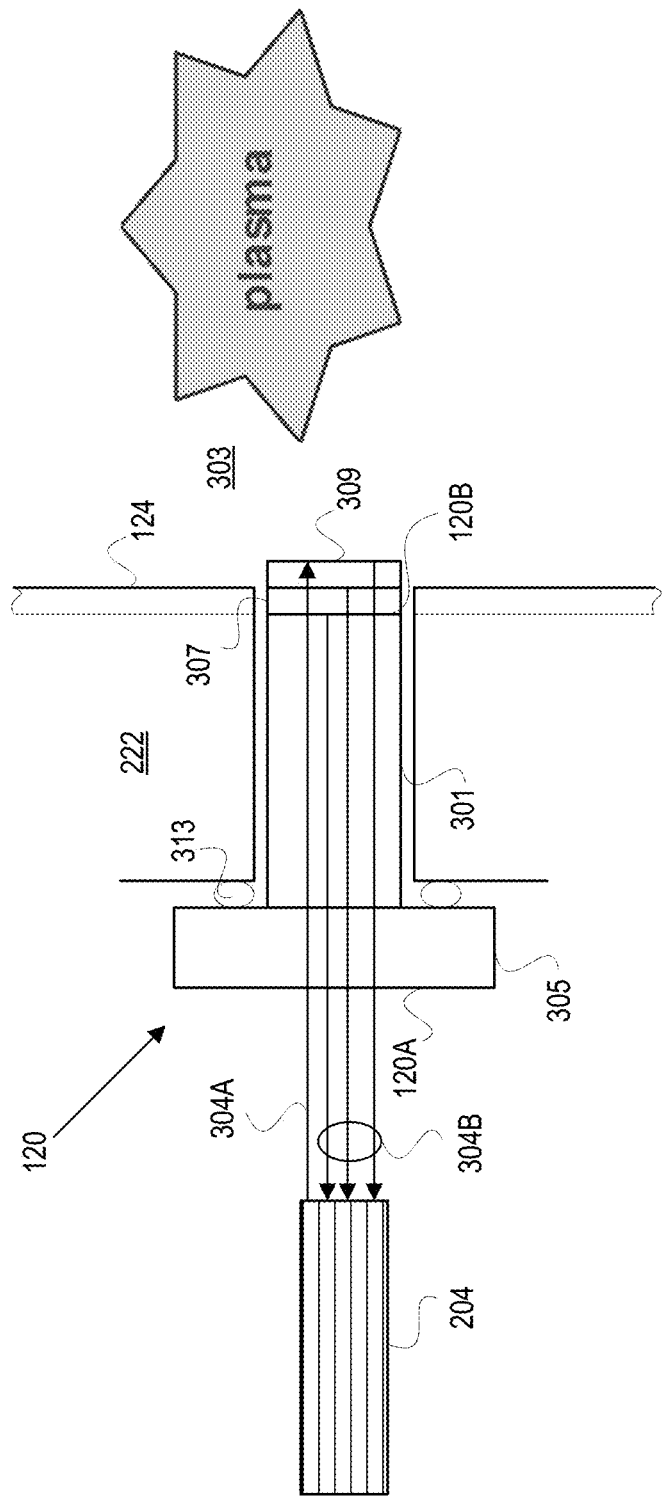
FIG. 3 is an enlarged portion of the side view of the system of FIG. 2 illustrating a transparent crystal and deposited transparent thin film embedded within a wall and a liner of a processing chamber, according to an embodiment.

FIG. 3 is an enlarged portion of the side view of the system of FIG. 2 illustrating the transparent crystal 120 embedded within the wall 222 and the liner 124 of a processing chamber 303, according to an embodiment. The transparent crystal 120 may have a proximal end and a distal end, the proximal end having a proximal surface 120A that receives light from the light coupling device 204 and the distal end 120B having a distal surface 120B to reflect the light back to the light coupling device 204 through the proximal surface 120A. The distal surface 120B of the transparent crystal 120 may be proximate to the processing chamber 303 and can be made approximately flush with the inside surface of the wall 222 in one embodiment.

In various embodiments, the transparent crystal 120 may be shaped like a plug (e.g., be plug-shaped) and include a shaft 301 and a flange 305 integrally formed with or attached to the shaft 301. The plug may be a sapphire plug, a diamond plug, a quartz plug, or a silicon carbide plug. The shaft 301 and/or the flange 305 may be square, rectangular, cylindrical, or other shape. For simplicity of illustration, the shaft 301 and the flange 305 are both illustrated as being cylindrical. As discussed, the transparent crystal 120 may be made out of a transparent gem such as sapphire, diamond, quartz, silicon carbide, or the like to provide a hard material resistant to change and be reflective of light. The shaft 301 may be embedded within the wall 222 and liner 124 such that the distal surface is exposed to an interior of the processing chamber 303.

The flange 305 may abut an outside surface of the wall 222. In an embodiment, a seal 313 is positioned between the flange and the outside surface of the wall 222. The seal 313 may be, for example, an O-ring seal, a rectangular seal or gasket seal, a bulb seal, and the like. A material of the seal 313 may be propylene diene monomer, a fluoroelastomer, or the like. The flange 305 may have an inner surface that is in physical contact with the seal 313, where the inner surface includes a surface roughness (Ra) of less than 20 nanometers or an at least 80/50 scratch dig value, which is an optical specification used for surface roughness. The highly smooth inner surface of the flange 305 may help provide a tight seal between the less clean atmosphere outside of the processing systems 100, 200 and the highly clean, filtered air of the processing chamber 303, which may also be under vacuum.

In various embodiments, a transparent thin film 307 may be deposited, e.g., via atomic layer deposition (ALD), onto the distal surface 120A of the shaft 301 of the transparent crystal 120. In some cases, the transparent thin film 307 is deposited on the transparent crystal 120 before the transparent crystal 120 is embedded within the wall 222 and the liner 124. The transparent thin film 307 may be exposed to the interior of the processing chamber 303. In some embodiments, the transparent thin film 307 is approximately flush with the liner 124 and made to have chemical properties substantially matching those of the liner, as was discussed previously. In various embodiments, the transparent thin film 307 is yttrium oxide, aluminum oxide, zirconium oxide, or a combination thereof to make a similar transparent alloy. In one embodiment, the transparent thin film 307 is yttrium oxide, is between 10 nm to 1 micrometer (μm) thick, e.g., 270 nm thick, and is deposited to a known thickness, which helps analyze the reflected light.

In various embodiments, the deposition process (e.g., ALD) of the transparent thin film 307 is carefully controlled to ensure it mimics the material of the liner 124 but is in a different physical state, e.g., being smoother and flatter, in order to facilitate the reflection of light from its surface. In this way, the transparent thin film 307 reflects light in a way that provides an accurate condition of the chamber, and the thinness and smoothness increases signal-to-noise ratio (SNR) of the distal surface, facilitating the ability to test thinner process film layers 309 within the processing chamber 303. The transparent thin film 307 also passivates and protects the material of the transparent crystal 120, allowing the costly transparent crystal 120 to last longer in the corrosive processing environment of the processing chamber 303.

In some embodiments, a process film layer 309 (e.g., process thin film layer) is deposited during processing within the processing chamber 303. The process film layer 309 may include a film stack that is to be measured by the spectrometer 225. The light coupling device 204 may collimate the light provided by the light source 201 and direct collimated light 304A through the proximal surface 120A of the transparent crystal 120, e.g., the outer surface of the flange 305. This incoming light is then reflected off of the distal surface 120B of the transparent crystal, e.g., of the shaft 301, off of the surface of the transparent thin film 307, and off a surface of the process film layer 309. These three sources of reflected light come back together, illustrated as reflected light 304B, and enter back into the light coupling device 204. The light coupling device 204 may focus the reflected light into the fiber optic cable 232 for entry into the spectrometer for measurement (see FIG. 2).

The return light signals at each interface (e.g., the above-mentioned three surfaces) may all combine optically resulting in constructive and destructive interference. The exact nature of this interference depends on the relative thickness of each layer, e.g., the transparent crystal 120, the transparent thin film 307, and the process film layer 309 (or film stack). The final result measured by the spectrometer 225 (and after normalizing to an initial reference) is a spectra with interference fringes. These fringes may be fit with a mathematical thin film model, which can then determine one or more thin film optical parameters of the process film layer 309 such as thickness, n, and k values. The n and k values may be used to determine a composition material. Knowing the exact initial thickness and optical properties of the transparent thin film 307 thus helps with the fitting of the spectra to the thin film model.

Figure 4A:
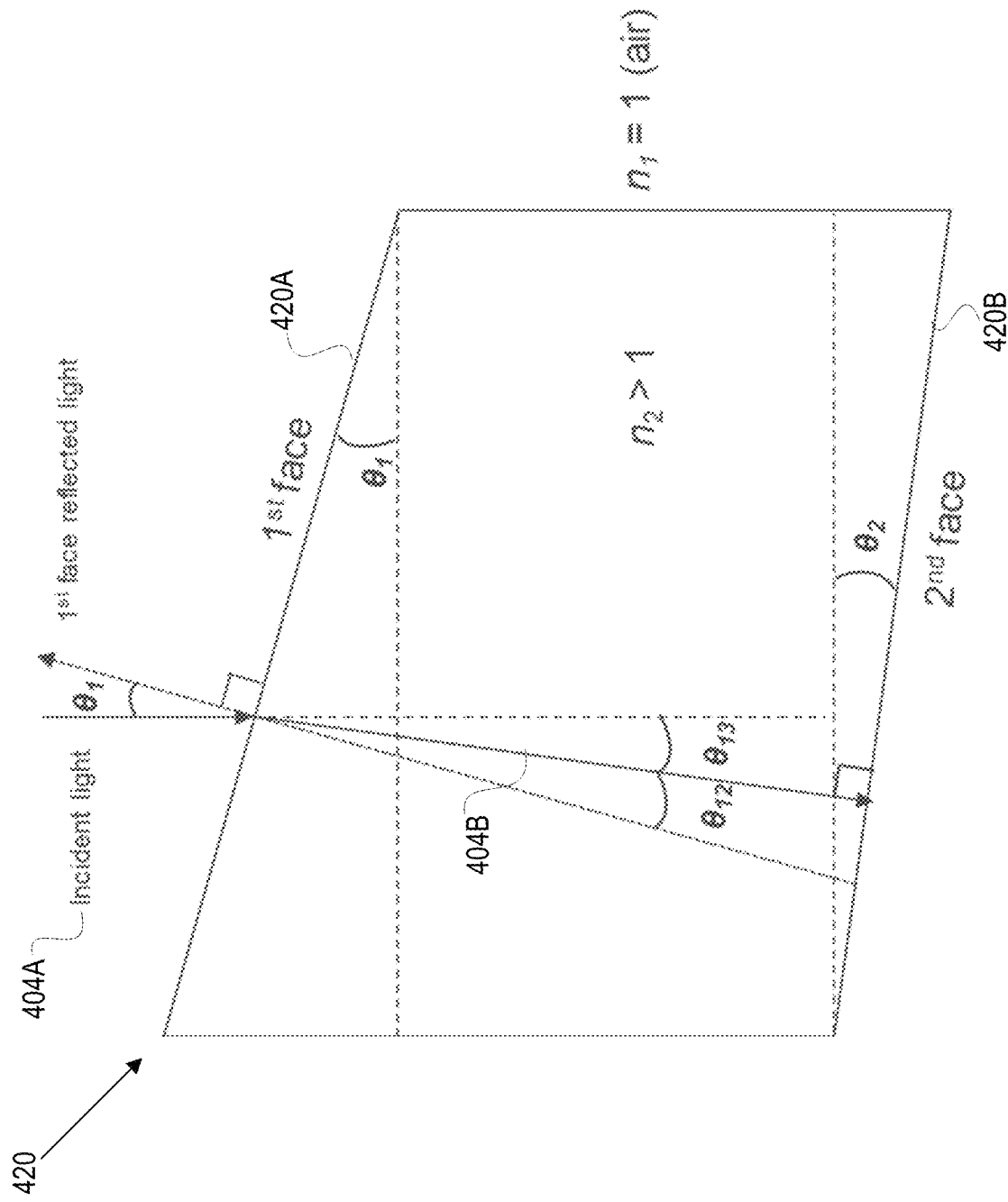
FIG. 4A is a simplified side view of the transparent crystal for purposes of explaining angles that may be formed on a proximal surface and a on a distal surface with reference to the liner or wall, according to various embodiments.

FIG. 4A is a simplified side view of a transparent crystal 420 for purposes of explaining angles that may be formed on a proximal surface 420A (or first face) and on a distal surface 420B (or second face) with reference to the liner 122 or the wall 222 of the processing chamber 303, according to various embodiments. Note that the lines and angles in FIG. 4A are exaggerated for ease of explanation and are thus not drawn to scale.

As a reminder, the distal surface 120B of the transparent crystal 120 may be approximately flush with the wall 222 of the processing chamber 303. Back reflection from the proximal surface 120A may not contribute to a sensor signal and reduces the effective dynamic range of detection by the spectrometer 225. Thus, the transparent crystal 120 may be designed with a first angle ($\theta_1$) that is a slight tilt relative to the incoming collimated light 404A. The first angle ($\theta_1$) may be, for example, between two ("2") and five ("5") degrees. In one embodiment, the first angle ($\theta_1$) is three ("3") degrees.

The light that passes through is refracted, e.g., refracted light 404B, so an optimal angle of the proximal surface 420B for maximum reflection may be normal to this refracted light beam. In one embodiment, this optimal or second angle ($O_2$) may be between 0.8 and 1.8 degrees. In one embodiment, the second angle ($\theta_2$) is 1.3 degrees. Note that $\theta_1$ is equal to $\theta_{12}+\theta_{13}$. Further, Snell's law requires:

$$n_1 \sin \theta_1 = n_2 \sin \theta_{12} \qquad (1)$$

$$\theta_{12} = \sin^{-1}\left(\frac{n_1 \sin \theta_1}{n_2}\right), \qquad (2)$$

as expressed in Equations 1 and 2. Equation 3 expresses the maximum reflection off of the distal surface 420B.

$$\theta_2 = \theta_{13} = \theta_1 - \theta_{12} \qquad (3)$$

Thus, if the transparent crystal is made of sapphire by way of example only, the following may result in the following approximate optimal angles:

$$\theta_2 = \theta_1 - \sin^{-1}\left(\frac{n_1 \sin \theta_1}{n_2}\right) \qquad (4)$$

$\theta_2 \approx 1.3°$ assuming $\theta_1 = 3°$, $n_2 = 1.8$ (sapphire).

If a different first angle ($\theta_1$) is chosen, the second angle ($\theta_2$) may differ as determined by the Equation 4. In alternative embodiments, the optical components, e.g., at least the light coupling device 204 may be tilted by the first angle ($\theta_1$) to make incident light optimal for the proximal surface 420A. The proximal surface 420A may thus remain at no angle with respect to the wall the processing chamber and the distal surface 420B may be angled slightly to maximize reflection off the distal surface 420B. Alternatively, the light coupling device 204 may tilted by the second angle ($O_2$) and thus be at an optimal angle with respect to the distal surface 420B. In this embodiment, the distal surface 420A may have no angle with respect to the wall, and the proximal surface 420A may then be titled at a slight angle to reduce back reflection of the incoming collimated light 404A.

FIG. 4B is a simplified side view of the transparent crystal that includes no surface angles, according to an embodiment. Accordingly, the proximal surface 420A and the distal surface 420A are flat, and have no angle designed into their respective surfaces. This type of plug for the transparent crystal is simpler to build but may suffer from a reduced dynamic range and sensitivity due to back reflection from the proximal surface 420A.

FIG. 4C is a detailed side view of the transparent crystal with relevant dimensions, including some angles of FIG. 4A, according to an embodiment. In FIG. 4C, the transparent crystal 420 includes a proximal surface 420A with a first angle ($\theta_1$) of approximately three degrees. The transparent crystal 420 may further include a distal surface with a second angle of approximately 1.3 degrees. Variations in optimal ranges of the first angle and the second angle are expected and may be calculated according to Equation 4 given a selected first angle. While the transparent crystal 420 of FIG. 4A and FIG. 4B is more complex to design and manufacture, it has a better dynamic range and sensitivity to film deposition on the distal surface 420B.

Figure 5:
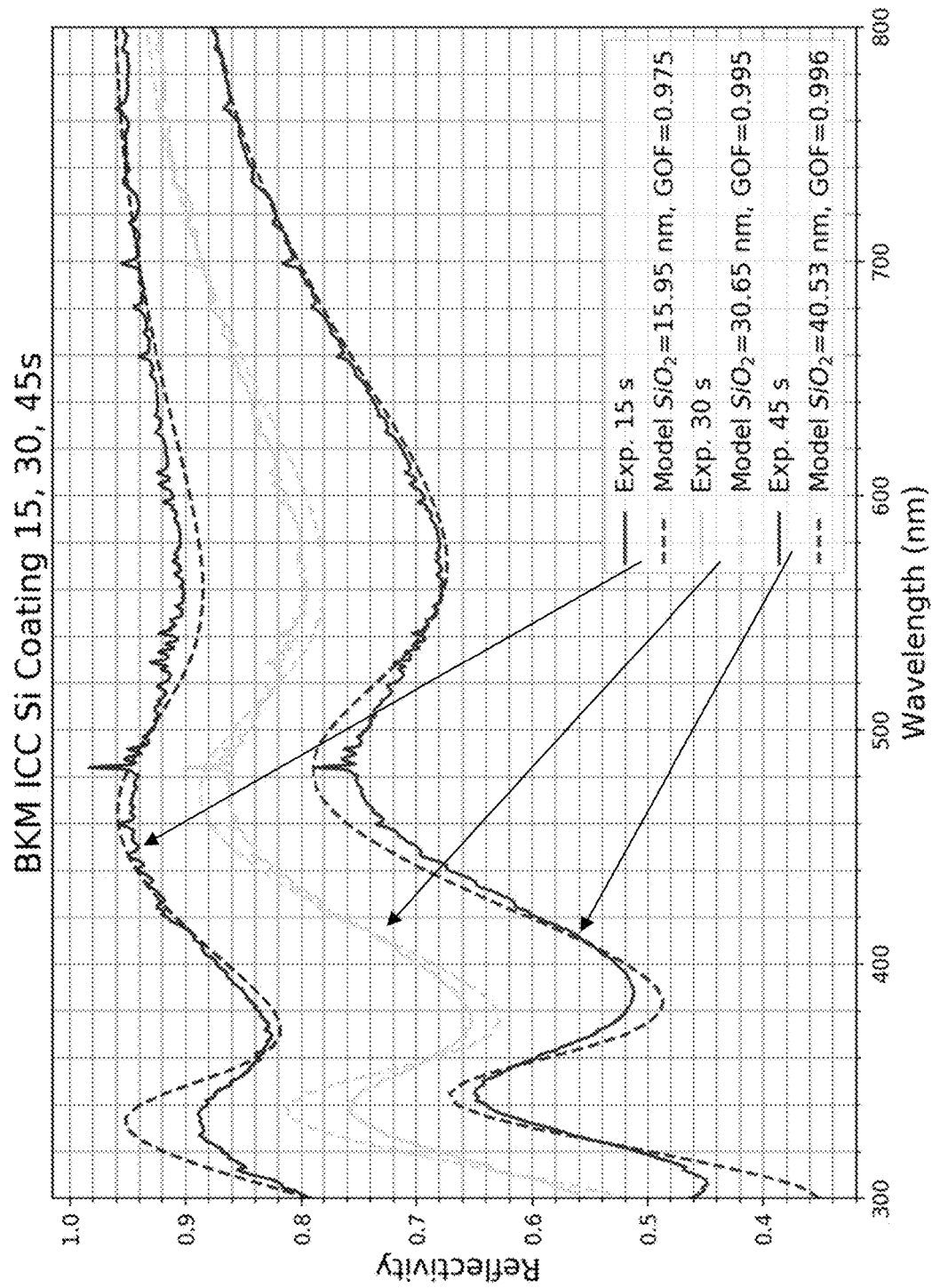
FIG. 5 is a graph of reflectivity versus wavelength for a number of different process film layers compared with computer modeled versions, according to various embodiments.

FIG. 5 is a graph of reflectivity versus wavelength for a number of different process film layers compared with computer modeled versions, according to various embodiments. Note that the different process film layers differ in thickness and result in a correspondingly different reflectivity signal. Each experiment (solid curves) includes a corresponding simulated model (dashed curves). This graph thus illustrates that a reflectivity signal (or reflectometry signal) may be analyzed to determine a thickness of the process film layer.

Figure 6A:
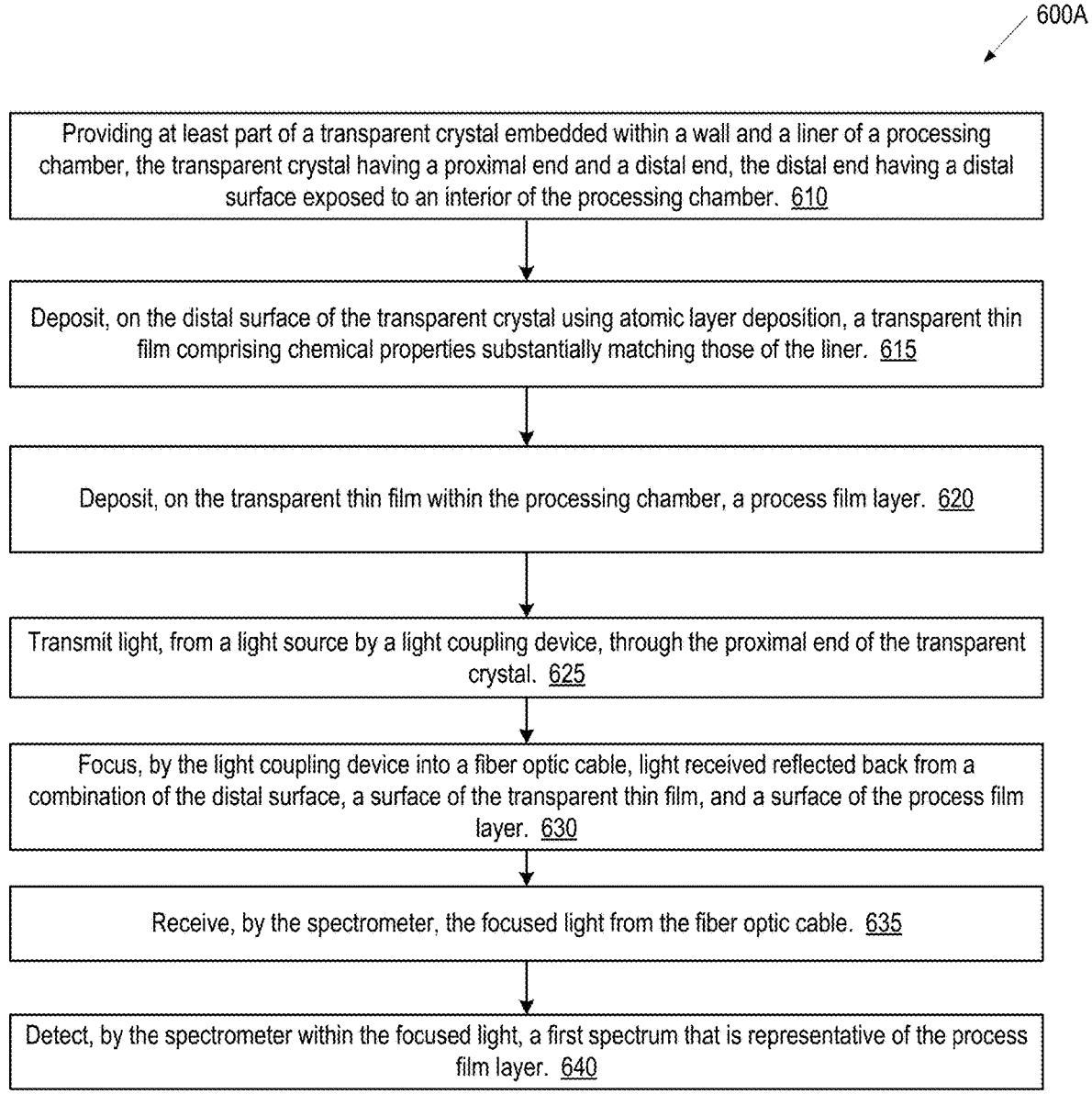
FIG. 6A is a flow chart of a method for measuring a first spectrum of a process film layer on the transparent thin film, according to an embodiment.

FIG. 6A is a flow chart of a method 600A for measuring a first spectrum of a process film layer on the transparent thin film, according to an embodiment. The method 600A may be performed with the components described with reference to FIGS. 1-4A, as will be apparent. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the method 600A may include providing at least part of a transparent crystal 120 embedded within a wall and a liner of a processing chamber. The transparent crystal 120 has a proximal end and a distal end, the distal end having a distal surface that is exposed to an interior of the processing chamber. The part of the transparent crystal 120 embedded within the wall and the liner may be the shaft 301, as illustrated in FIG. 3. The transparent crystal 120 may be one of sapphire, diamond, or another sufficient hard and sufficiently transparent crystal.

At operation 615, the method 600A may further include depositing, on the distal surface of the transparent crystal 120 using atomic layer deposition (ALD), a transparent thin film having chemical properties substantially matching those of the liner. The transparent thin may be film yttrium oxide, aluminum oxide, or zirconium oxide or similar alloy and be of a known thickness. The deposition performed in operation 615 may be performed before embedding the transparent crystal 120 into the wall and liner of the processing chamber.

At operation 620, the method 600A continues with depositing, on the transparent thin film within the processing chamber, a process film layer. This process film layer may be a chemical or plasma based deposited thin film layer, and sometimes may include a film stack that has bottom layers of accumulation before the processing chamber is cleaned.

At operation 625, the method 600A continues with transmitting light, from a light source by a light coupling device, through the proximal end of the transparent crystal. The light source 201 may be a flash lamp and was discussed in detail with reference to FIG. 2. The light coupling device 204 may be a collimator, mirror, or set of mirrors, and was discussed in detail with reference to FIGS. 2-3.

At operation 630, the method 600A continues with focusing, by the light coupling device into a fiber optic cable, light received reflected back from a combination of the distal surface, a surface of the transparent thin film, and a surface of the process film layer. These three different reflective lights may add constructively and destructively depending on thickness of these three different layers as discussed with reference to FIG. 3.

At operation 635, the method 600A may continue with receiving, by the spectrometer, the focused light from the fiber optic cable as discussed in detail with reference to FIG. 2. At operation 640, the method 600A may continue with detecting, by the spectrometer within the focused light, a first spectrum that is representative of the process film layer.

Figure 6B:
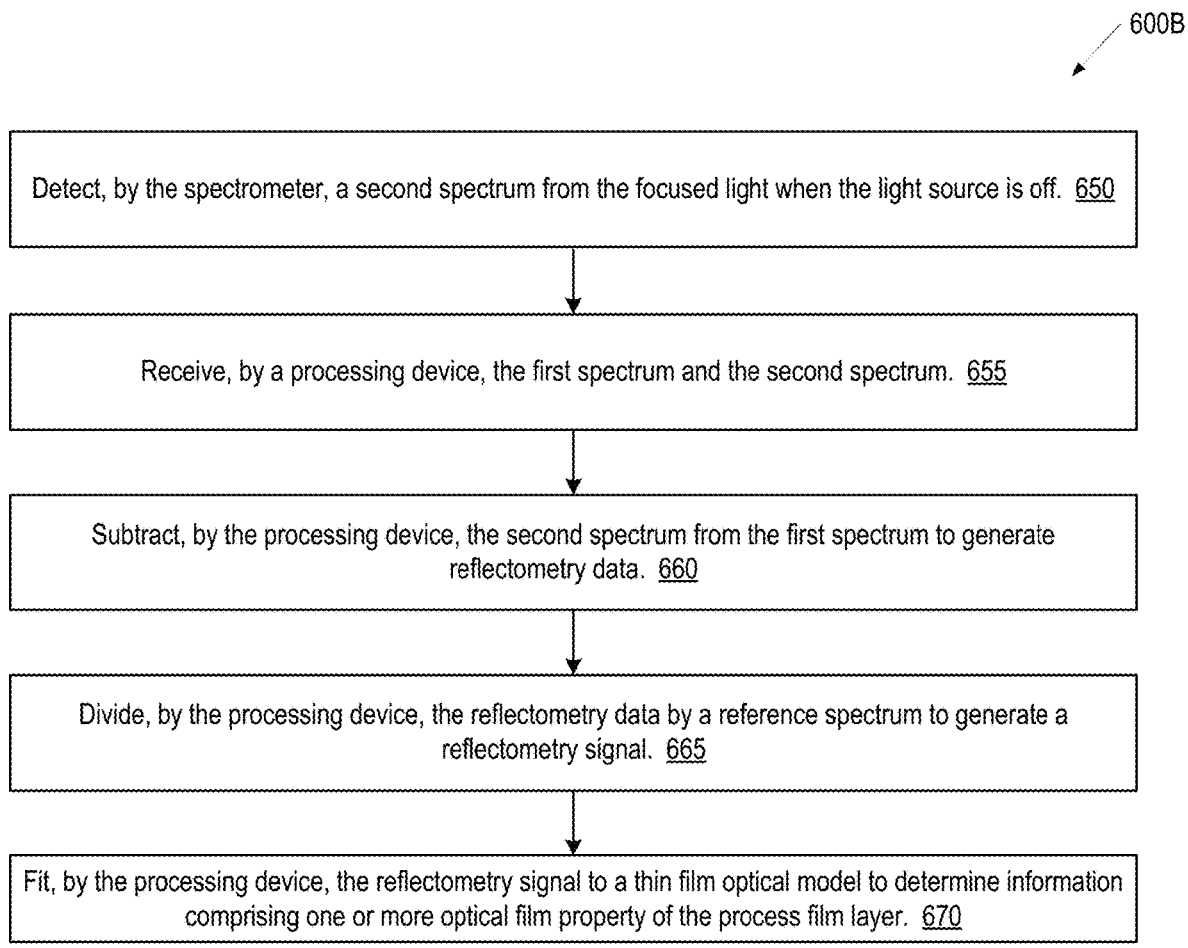
FIG. 6B is a flow chart of a method for measuring a second spectrum (without light on) of the deposited thin film to, together with the first spectrum, determine one or more optical film property of the process film layer, according to an embodiment.

FIG. 6B is a flow chart of a method 600B for measuring a second spectrum (without light on) of the deposited thin film to, together with the first spectrum, determine one or more optical film property of the process film layer, according to an embodiment. The method 600B may be performed with the components described with reference to FIGS. 1-4A, as will be apparent. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 650, the method 600B includes detecting, by the spectrometer, a second spectrum from the focused light when the light source is off. This second spectrum may be the OES of the processing chamber at the time of measurement of the first spectrum.

At operation 655, the method 600B may continue with receiving, by a processing device, the first spectrum and the second spectrum. The processing device may be the processing device 130 or the controller 109 illustrated in FIGS. 1-2.

At operation 660, the method 600B may continue with subtracting, by the processing device, the second spectrum from the first spectrum to generate reflectometry data. This reflectometry data may also be generated without this step when there is no plasma in the processing chamber and thus the measurement of the first spectrum is before or after plasma-based processing. At operation 665, the method 600B may continue with dividing, by the processing device, the spectrometry data by a reference spectrum to generate a reflectometry signal. The reference spectrum may be obtained under known conditions, such as during initial installation of the system. The dividing may normalize the spectrometry data into a spectrometry signal that is capable of analysis germane to the deposited process film layer.

At operation 670, the method 600B may continue with fitting, by the processing device, the reflectometry signal to a thin film optical model to determine information comprising one or more optical film property of the process film layer. The one or more optical film property may be a film thickness, values for n and k, and/or a composition material of the process film layer.

Figure 7:
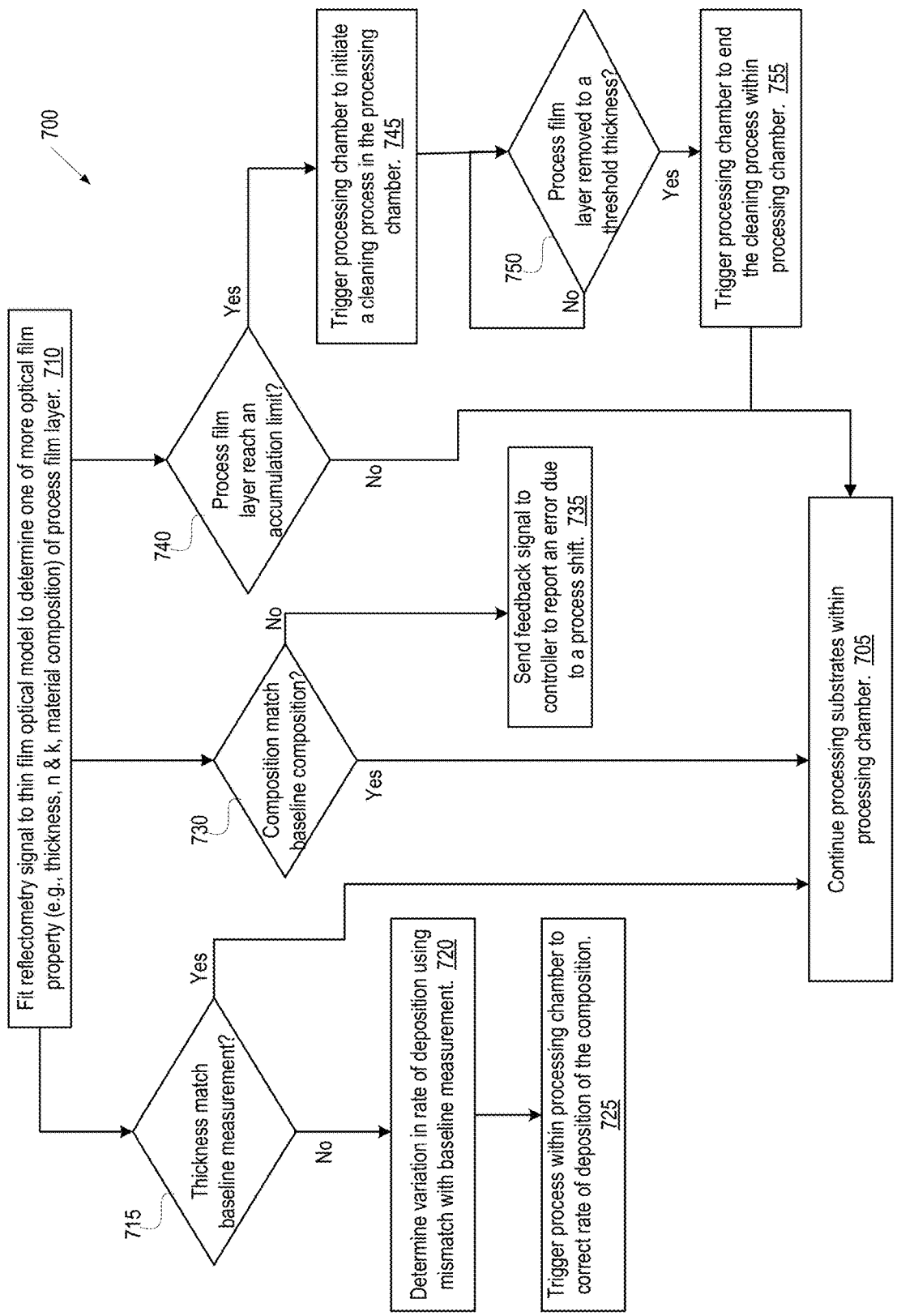
FIG. 7 is a flow chart of methods using one or more optical film property of the deposited thin film on the transparent thin film to improve the processing within the processing chamber, according to various aspects of the disclosure.

FIG. 7 is a flow chart of methods 700 using one or more optical film property of the process film layer on the transparent thin film to improve the processing within the processing chamber, according to various aspects of the disclosure. The method 700 may be performed by processing logic that may include hardware (circuitry, dedicated logic, etc.), software (such as is run on a general purpose computer system or a dedicated machine), firmware, or some combination thereof. For example, the methods 700 may be performed by the controller 109 (e.g., the processing device 130) as these components are referenced herein. In embodiments, the various baselines or threshold values (such as variations in thickness or for n and k) may be stored and indexed against particular compositions within the memory 134 of the controller 109. These values may be used by way of comparison by the various methods 700 now discussed. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 7, the methods 700 may begin with the processing logic processing a reflectometry signal to fit the reflectometry signal to a thin film optical model to determine one or more optical film property (e.g., thickness, values for n and k, and/or material composition) of the process film layer 309 deposited on the transparent thin film 307 (710). When measurements are taken during processing substrates within the processing chamber, the methods 700 may continue with the processing logic determining whether the thickness matches a baseline measurement for the process film layer, e.g., given the composition of the process film layer 309 (715). If yes, there is a match, the methods 700 may continue with processing substrates within the processing chamber (705). If there is not a match, the methods 700 may continue with the processing logic determining, based on the thickness comparison, that a variation in a rate of deposition of the process film layer 309 that is beyond a threshold variation (720).

In various embodiments, the threshold variation may be sufficient to merit a change in the deposition process. Any such threshold variation may be specific to the application, and may be empirically determined based on how much variation is needed to induce a process shift. Also, the process being monitored may be etch, deposition, or the like. The methods 700 may continue with the processing logic triggering a process within the processing chamber that is to correct the rate of deposition of the process film layer (725). This portion of the methods 700 may, in this way, use differential measurements compared to a baseline measurement over time to determine whether processes of the processing chamber have shifted (or drifted) over time.

The methods 700 may similarly continue with the processing logic determining whether the material composition of the process film layer 309 matches a baseline composition expected to be deposited on the transparent thin film (730). If yes, there is a match, the methods 700 may continue with processing substrates within the processing chamber (705). If there is not a match, the methods 700 may continue with the processing logic sending a feedback signal to the controller 109 (or other computing device with an interface to processing system operators) to report an error due to a process shift detected within the processing chamber (735). The process shift may be detected in the fact that the detected composition has drifted from the expected composition. This portion of the methods 700 may be performed while the processing system is inactive in one embodiment.

In some embodiments, the methods 700 may continue with the processing device determining, during or after processing a substrate within the processing chamber, whether the process film layer on the transparent thin film has reached an accumulation limit (e.g., limit on accumulated thickness required to be within specification) (740). If not, the methods 700 may continue with processing substrates within the processing chamber (705). If yes, the methods 700 may continue with the processing logic triggering the processing chamber to initiate a cleaning process in the processing chamber (745). This cleaning process may be intended to clean the processing equipment and surfaces of built-up films in order to improve future processing results, and/or to return the processing equipment to a certain specification. The cleaning process may also require a plasma process and thus may also have an OES to subtract off the spectrum determined with the light source on to determine the reflectometry signal.

In various embodiments, the methods 700 may continue with, during such a cleaning process triggered by operation 745, determining whether the process film layer has been removed to a predetermined threshold thickness (750). Such a determination may be to check whether the process film layer has been sufficiently reduced by the cleaning process. Once the process film layer has been removed to or beyond the predetermined threshold thickness, the method 700 may continue with the processing logic triggering the processing chamber to end the cleaning process being performed within the processing chamber (755). Once completed, the method 700 may continue with processing substrates within the processing chamber (705).

Additional or similar methods to the method 700 of FIG. 7 are envisioned. For example, during processing substrates within the processing chamber, the processing logic may detect a moment in time when the process film layer has reached a threshold level of thickness on the transparent thin film 307. The processing logic may further trigger an end to the deposition process that is depositing the deposited film layer within the processing chamber. The processing logic may make other similar decisions as this to update a process or process state of the processing chamber to improve substrate throughput, quality, and/or reduce produces shift.

According to a further embodiment, the processing chamber may, in some cases, run a cleaning process after every substrate (or group of substrates) processed, or at some other periodicity. The processing logic can accurately determine the moment that the endpoint of this clean is reached on the distal surface 120B or 420B of the transparent thin film 307. It can then send a trigger the processing chamber to stop the clean and proceed to the next step, improving throughput. If the distal surface 120B or 420B does not clean at the same rate as the rest of the chamber, this difference can be characterized beforehand and compensated via a lookup table in the controller 109.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
    a transparent crystal, wherein at least part of the transparent crystal is embedded within a wall and a liner of a processing chamber;
    a transparent thin film deposited on a surface of the transparent crystal that is exposed to an interior of the processing chamber;
    a spectrometer configured to:
        receive light reflected from a surface of the transparent thin film and a surface of a process film layer deposited on the transparent thin film; and
        detect a first spectrum within the received light that is representative of the process film layer; and
    a processing device coupled to the spectrometer and configured to:
        receive, from the spectrometer, the first spectrum;
        receive, from the spectrometer, a second spectrum when a source of the received light is off;
        generate a reflectometry signal based on a reference spectrum and a difference between the second spectrum and the first spectrum; and
        fit the reflectometry signal to a thin film optical model to determine information comprising one or more optical film property of the process film layer.

2. The system of claim 1, wherein the transparent thin film comprises one of yttrium oxide, aluminum oxide, or zirconium oxide and is of a known thickness.

3. The system of claim 1, wherein, to generate the reflectometry signal, the processing device is further configured to:
    calculate reflectometry data via subtraction of the second spectrum from the first spectrum; and
    calculate the reflectometry signal via division of the reflectometry data by the reference spectrum.

4. The system of claim 1, wherein the one or more optical film property comprises thickness, and wherein, during processing substrates within the processing chamber, the processing device is further configured to:
    compare the thickness with a baseline measurement for the process film layer;
    determine, using the comparison, a variation in a rate of deposition of the process film layer that is beyond a threshold variation; and
    trigger a process within the processing chamber that is to correct the rate of deposition of the process film layer.

5. The system of claim 1, wherein the one or more optical film property comprises thickness, and wherein, after processing a substrate within the processing chamber, the processing device further configured to:
    detect a moment in time at which the process film layer on the transparent thin film has been removed within a predetermined threshold thickness; and
    in response to the detection, trigger the processing device to end a cleaning process within the processing chamber.

6. The system of claim 1, wherein the one or more optical film property comprises thickness, and wherein, during processing substrates within the processing chamber, the processing device further configured to:

detect a moment in time when the process film layer has reached a threshold level of thickness on the transparent thin film; and trigger an end of a deposition process that is depositing the process film layer.

7. The system of claim 1, wherein the transparent crystal is one of a sapphire plug, a diamond plug, or a silicon carbide plug, and wherein the transparent crystal includes a proximal end and a distal end, the distal end having a distal surface that is exposed to the interior of the processing chamber.

8. The system of claim 7, wherein the distal surface of the transparent crystal is formed at an angle with respect to the liner, the angle being between 0.8 and 1.8 degrees.

9. The system of claim 7, further comprising:

a light coupling device coupled to the spectrometer, the light coupling device configured to:

transmit the light, from a light source, through the proximal end of the transparent crystal; and focus, into the spectrometer, light received reflected back from a combination of the distal surface, the surface of the transparent thin film, and the surface of a process film layer.

10. The system of claim 9, further comprising a fiber optic cable coupled to the light coupling device, the fiber optic cable to transmit the received light to the spectrometer.

11. The system of claim 1, wherein the transparent thin film has chemical properties substantially matching those of the liner.

12. A processing chamber comprising:

a wall to define an interior of the processing chamber;

a liner attached to an inside surface of the wall;

a transparent crystal that is plug-shaped and comprises:

a shaft embedded within the wall and the liner, the shaft comprising a distal surface of the transparent crystal that is exposed to an interior of the processing chamber; and a flange that abuts an outside surface of the wall and comprises a proximal end of the transparent crystal; and a transparent thin film deposited on the distal surface, wherein light is to pass through the transparent crystal and reflect off the distal surface and off a surface of the transparent thin film back through the proximal end of the transparent crystal.

13. The processing chamber of claim 12, wherein the transparent thin film comprises one of yttrium oxide, aluminum oxide, or zirconium oxide and is of a known thickness.

14. The processing chamber of claim 12, wherein the distal surface of the transparent crystal is formed at an angle with respect to the liner, the angle being between 0.8 and 1.8 degrees.

15. The processing chamber of claim 12, wherein the transparent crystal is one of a sapphire plug, a diamond plug, or a silicon carbide plug, and wherein the processing chamber further comprises a seal positioned between the flange and the outside surface of the wall.

16. The processing chamber of claim 15, wherein the flange comprises an inner surface that is in physical contact with the seal, the inner surface comprising a surface roughness (Ra) of less than 20 nanometers.

17. The processing chamber of claim 12, wherein a proximal surface at the proximal end of the transparent crystal is formed at an angle with respect to the outside surface of the wall, the angle being between 2 and 5 degrees.

18. The processing chamber of claim 12, wherein the distal surface of the transparent crystal is approximately flush with the inside surface of the wall.

19. The processing chamber of claim 12, wherein the transparent thin film has chemical properties substantially matching those of the liner.

* * * * *